United States Patent [19]
Gailliard et al.

[11] Patent Number: 4,606,296
[45] Date of Patent: Aug. 19, 1986

[54] EVAPORATION CELL FOR A LIQUID COMPOUND SUITABLE FOR EPITAXY BY MOLECULAR JETS

[75] Inventors: Jean P. Gailliard; Alain Million, both of Grenoble; Jean Piaquet, Eybens, all of France

[73] Assignee: Commissariat A L'Energie Atomique, Paris, France

[21] Appl. No.: 714,955

[22] Filed: Mar. 22, 1985

[30] Foreign Application Priority Data

Mar. 30, 1984 [FR] France ................................ 84 05050

[51] Int. Cl.$^4$ ............................................. C23C 16/00
[52] U.S. Cl. ................................... 118/726; 118/724; 156/DIG. 103
[58] Field of Search ...................... 118/726, 724, 50.1; 156/610, 614, DIG. 103

[56] References Cited

U.S. PATENT DOCUMENTS 2,426,377 8/1947 Smith, Jr. ............................... 427/83
3,634,647 1/1972 Dale, Jr. ................................ 219/121

FOREIGN PATENT DOCUMENTS 1043010 11/1958 Fed. Rep. of Germany .

OTHER PUBLICATIONS

Journal of Crystal Growth vol. 54 (Sep., 1981).

*Primary Examiner*—Norman Morgenstern
*Assistant Examiner*—K. Jaconetty

[57] ABSTRACT

Evaporation cell for a liquid compound suitable for molecular jet epitaxy on a substrate from a compound which is liquid at ambient temperature and which comprises in per se known manner a cell containing said liquid compound in a main ultravacuum enclosure, the cell being provided with heating means. It comprises a preliminary vacuum enclosure tightly connected to the main enclosure and having a first opening provided with a valve and a pipe for forming and regulating the preliminary vacuum in the preliminary vacuum enclosure, an upwardly oriented second opening linked with a chamber containing a large free surface area reservoir for receiving a liquid compound stock, as well as a third downwardly oriented opening linked with a disassemblable reservoir for emptying the liquid compound, while in the preliminary vacuum enclosure is provided a three-way cock connecting the cell containing the liquid compound either to the large surface reservoir, or to the disassemblable reservoir.

2 Claims, 3 Drawing Figures

EVAPORATION CELL FOR A LIQUID COMPOUND SUITABLE FOR EPITAXY BY MOLECULAR JETS

BACKGROUND OF THE INVENTION

The present invention relates to an apparatus for producing deposits by epitaxy on a substrate using molecular jets and a compound, which is normally liquid at ambient temperature.

Figure 1:
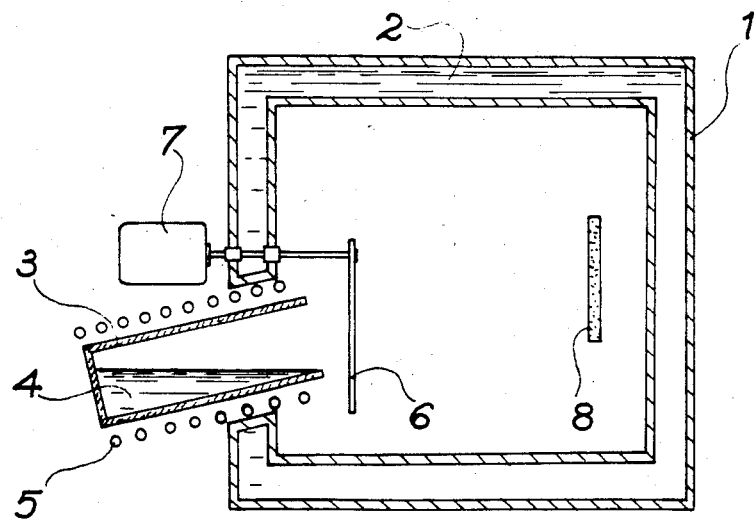

In the vacuum deposition of a product by epitaxy on a substrate to be covered, use is made in known manner and as shown in FIG. 1 of an ultravacuum enclosure 1, which is e.g. kept at a pressure of approximately $10^{-9}$ Torr and cooled by a heat shield, which has a peripheral layer of liquefied gas at low temperature, e.g. nitrogen. FIG. 1 shows that the cell 3 for the production of the actual molecular jet used for the epitaxial deposit and containing the products 4 to be deposited, maintained at the necessary temperature by electric furnace 5. A concealable screen 6 can be rotated by an external control means 7 and can consequently release the molecular jet formed by the action of furnace 5 in enclosure 1, so that it can reach the substrate 8 to be covered.

Installations of this type lead to operating problems, which have not hitherto been satisfactorily solved when one of the products to be evaporated on the substrate in the form of a molecular jet is a normally liquid substance having a high vapour pressure at ambient temperature. A typical example of this hypothesis is the epitaxial growth of layers of mercury compounds projected onto the substrate by a molecular jet using the apparatus of FIG. 1. In evaporation cells, which use a substance in the liquid state for carrying out molecular jet epitaxy, two essential problems have to be solved:

(a) the high vapour pressure at the ambient temperature of the material to be projected or sprayed (e.g. mercury or an organoleptic compound) is incompatible with a prolonged residence in the ultravacuum environment of the working enclosure;

(b) the high consumption of the liquid product during the epitaxy operation and e.g. in the case of mercury to be sprayed in molecular jet form, the consumption can be roughly 20 g/h.

Attempts have already been made to solve the above problems in industrial installations by using a retractable cell for producing the molecular jet, it being possible to separate said cell from the main enclosure when it is not in use. However, this solution is difficult to realize, because it must be removed from the enclosure, which requires relatively complex technology.

Consideration has also been given to cooling the material to be projected at very low temperatures, in order to reduce its vapour pressure when the cell is not in use.

The problem of the consumption has been compensated in existing systems by discontinuous cell filling methods, which do not require the reventing of the cell.

Figure 2:
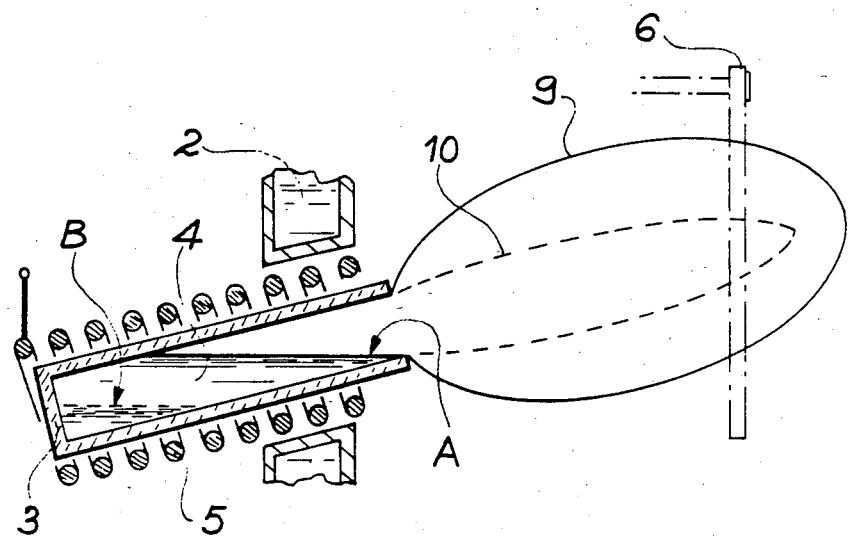

Unfortunately, all the installations putting the above means into use are very complex, sometimes difficult to use and often costly. Moreover, all the sources used for producing molecular jets of normally liquid substances at ambient temperature, lead to charge variations in the cell during use, such as e.g. during the formation of a crystalline Cd Hg Te layer, so that it is easy to empty more than half the cell. This variation leads to a poor temperature regulation of the cell due to the modification of its charge, as well as to a significant change to the molecular jet emission or discharge profile during use, due to the liquid level in the cell dropping, so that the angular dispersion of the jet varies. This shortcoming is illustrated in FIG. 2, where a cell 3 is surrounded by its insulation reservoir 2 and which contains the liquid 4 to be transferred to the not shown target. At the start of cell operation, the level of liquid 4 is at A and is at B at the end of use, the molecular jet profile obtained in the space being indicated in solid line form at 9 for level A and at 10 in broken line form for level B. It is readily apparent that this profile variation is usually unacceptable for ensuring the necessary quality characteristics with respect to the homogeneity and invariability of the crystalline deposit produced on the substrate by epitaxy.

SUMMARY OF THE INVENTION

The present invention relates to an apparatus for molecular jet epitaxy on a substrate and using a normally liquid substance at ambient temperature and which makes it possible to easily solve in an easily realizable manner all the aforementioned difficulties.

This apparatus comprises in per se known manner a cell containing the liquid compound in a main ultravacuum enclosure. The cell is provided with heating means in order to bring about the emission of the molecular jet directed onto the substrate to be coated and which is also contained in the enclosure. The apparatus is characterized in that it comprises a preliminary vacuum enclosure tightly connected to the main enclosure and having the necessary opening, namely a first opening provided with a valve and a pipe for forming and regulating the preliminary vacuum in said enclosure, an upwardly oriented opening linked with a chamber containing a large free surface reservoir for receiving a liquid compound stock, as well as a third downwardly oriented opening linked with a disassemblable reservoir for emptying the liquid compound, whilst in said preliminary vacuum enclosure is provided a three-way cock connecting the cell containing the liquid compound either to the large surface reservoir, or to the disassemblable reservoir.

According to a preferred embodiment of the invention, the chamber containing the large surface reservoir is connected, by means of a valve, to an introduction lock provided with a reservoir. This arrangement makes it possible to introduce, as required, the liquid compound into the large surface reservoir without breaking the preliminary vacuum of the enclosure.

Thus, the apparatus according to the invention has a fixed cell, enabling the discharge of the liquid compound from the cell when the latter is not in use, as well as the maintaining of a substantially constant level of said liquid compound in the cell when the latter is in use. The two aforementioned conditions are satisfied by means of a three-way cock or tap making it possible to link the cell either with a draining reservoir for discharging the liquid product during non-operating periods of the cell, or with a sufficiently wide reservoir serving as a storage means for the liquid compound, so that in this time it is possible by simply applying the connected vessel principle, to bring about a virtually constant level both in the wide reservoir and in the molecular jet emission cell.

Apart from a mechanical simplification compared with existing systems, the present invention leads to the following special advantages:

The reproducibility and ease of charging or loading, even during an evaporation process, A good adaptation of the temperature regulation, permitting a precise control of the flow, The stability of the emission indication curve which, associated with the previous advantage, makes it possible to accurately check the incident molecular jet on the substrate.

These advances are obtained, whilst retaining the advantages of discharging the mercury from the main enclosure, when the cell is stopped and of filling without breaking the vacuum.

DESCRIPTION OF THE DRAWINGS AND THE PREFERRED EMBODIMENT

Figure 3:
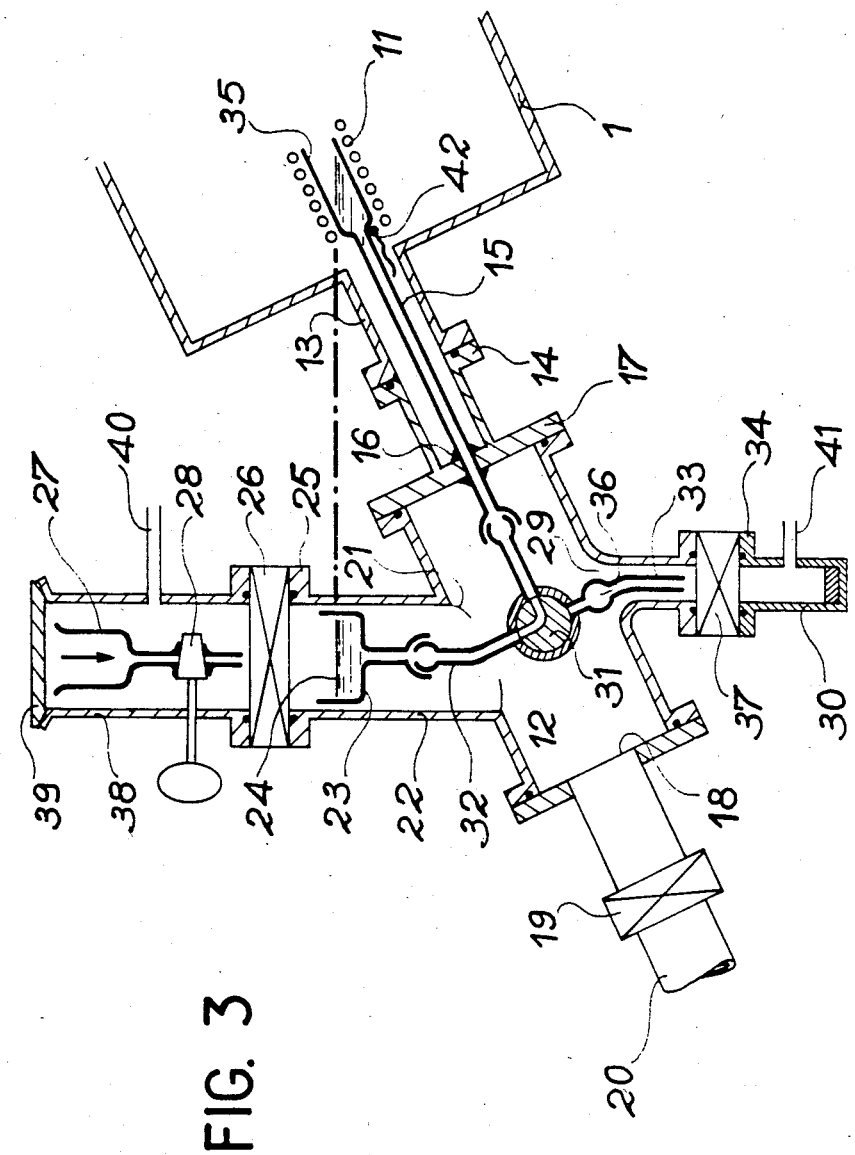

The invention will be better understood from referring to the enclosed FIG. 3, which illustrates in a non-limitative manner an embodiment of the apparatus for the epitaxy of a liquid compound at ambient temperature and which forms the subject matter of the present invention.

It is possible to see the quartz cell 35 located in the main enclosure, which is under a vacuum and contains the not shown substrate to be coated. Quartz cell 35 is heated with the aid of an electric furnace, indicated in the drawing by electric coils 11 and which is regulated by a thermocouple 42. The main enclosure 1 is connected to a preliminary vacuum enclosure 12 by a pipe 13, whose two parts are connected by a flange 14. A quartz tube 15 connects cell 35 to enclosure 12 via pipe 13. Quartz tube 15 passes through support 17 in a tight manner at 16 (quartz—metal weld or O-ring system), so as to close the opening of the preliminary vacuum enclosure 12.

According to the invention, the preliminary vacuum enclosure 12 has lateral openings. These consist of a first opening 18 provided with a valve 19 and a pipe 20, via which it is possible to form the necessary preliminary vacuum in enclosure 12 and maintain it at the desired value. A second opening 21 is provided on the upper part of enclosure 12 and is oriented in the upwards direction. Opening 21 is linked with a vertical chamber 22 containing the reservoir 23 having a large free horizontal surface area and which receives a large stock 24 of the liquid compound at ambient temperature and which is to be used in molecular jet form. The top of chamber 22 is enclosed by a flange cover 25, provided with a tight valve 26, connected to an introduction lock 38 able to supply reservoir 23 with a liquid compound, via container 27 and cock 28. This lock is provided with a fast opening and closing cover 39, as well as an opening 40 permitting the pumping thereof. There is also a third opening 29, which is oriented in the downwards direction and is linked with the disassemblable reservoir for discharging the liquid compound by means of valve 37. A three-way cock 31 makes it possible to connect tube 15 from cell 35 either to tube 32 from reservoir 23, or to tube 33 supplying the disassemblable reservoir 30. The latter is provided with an opening 41 permitting the pumping thereof.

The operation of the apparatus described relative to FIG. 3 is dependent on the three-way cock 31 and takes place in the following way. When the cock is positioned in such a way that it links tube 15 and tube 32, in the manner shown in FIG. 3, the levels of the liquid compound to undergo epitaxy are, due to the principle of connected vessels and the vacuum in enclosures 1 and 12, the same in both reservoir 23 and cell 35. When, during operation, the liquid of cell 35 is becoming exhausted, it is immediately replaced, in accordance with the communicating vessel principle, by a certain quantity of new liquid compounds from reservoir 23. Moreover, as the liquid surfaces present in cell 35 and reservoir 23 are in a small ratio of e.g. 1/20, the virtual invariability of the level in cell 35 is ensured as long as reservoir 23 contains liquid which can be permanently supplied by container 27 and cock 28 without breaking the vacuum in enclosure 12 and without interrupting epitaxy.

If it is wished to put cell 35 out of operation, the three-way cock 31 is turned in order to connect tubes 15 and 33, which move the vacuum from cell 35 into disassemblable reservoir 30. During this operation, a safety bulb 36, which must remain continuously full during draining, acts as a plug with respect to polluting impurities which could be introduced by the end of tube 33 into the main enclosure 1. Reservoir 30 can be disassembled by means of flange 34 and, after closing valve 37, it is possible to discharge the liquid compound therein without breaking the vacuum in enclosure 12.

The epitaxy apparatus shown in FIG. 3 can be used for producing varied molecular jets, provided that these are molecular jets of compounds which are normally liquid at ambient temperature. A possible application and which has proved to be of considerable interest is that of producing a mercury molecular jet source for forming epitaxial Cd Hg Te layers on a Cd Te compound. These layers more particularly make it possible to produce retinas in the infrared, whose pass band is 3 to 5 micrometers, or 8 to 12 micrometers, as a function of the epitaxial mercury quantity, which can be checked using the apparatus of FIG. 3.

What is claimed is:

1. An evaporation cell device for a liquid compound suitable for molecular jet epitaxy on a substrate from a compound which is liquid at ambient temperature, said device comprising: a main ultravacuum enclosure; an evaporation cell in said main ultravacuum enclosure and having a predetermined free surface area; heating means in said enclosure for bringing about emission of the molecular jet from the cell so as to be directed onto the substrate; a preliminary vacuum enclosure tightly connected to the main ultravacuum enclosure and having: a first opening provided with a valve and a pipe for forming and regulating a preliminary vacuum in said preliminary vacuum enclosure; a second, upwardly oriented opening connected to a chamber containing a first reservoir of a relatively large free surface area compared with that of said cell, for receiving a liquid compound stock; and a third, downwardly oriented opening connected to a second, disassemblable reservoir for emptying the liquid compound; and a three-way cock in said preliminary vacuum enclosure for connecting the cell selectively to the first or to the second reservoir.

2. An evaporation cell device according to claim 1, wherein the chamber is connected by a valve to an introduction lock equipped with a reservoir.

* * * * *